United States Patent [19]

Derouiche

[11] Patent Number: 5,664,681
[45] Date of Patent: Sep. 9, 1997

[54] MULTIPLE DEVICE CARRIER

[75] Inventor: Nour Eddine Derouiche, Raleigh, N.C.

[73] Assignee: Mitsubishi Semiconductor America, Inc., Durham, N.C.

[21] Appl. No.: 518,939

[22] Filed: Aug. 24, 1995

[51] Int. Cl.$^6$ ............................................. B65D 85/30
[52] U.S. Cl. ............................................. 206/722; 220/507
[58] Field of Search .................. 206/701, 718, 206/719, 722, 724, 726, 728, 562; 220/668, 507, 553, 554, 555; 211/26; 361/810, 829; 439/69

[56] References Cited

U.S. PATENT DOCUMENTS

| | | | |
|---|---|---|---|
| 2,995,686 | 8/1961 | Selvin | 439/69 X |
| 4,300,697 | 11/1981 | Dickens | 220/553 X |
| 4,607,685 | 8/1986 | Mitchell, Jr. | |
| 4,671,407 | 6/1987 | Brutosky | 206/718 |
| 5,059,557 | 10/1991 | Cragon et al. | |
| 5,103,976 | 4/1992 | Murphy | 206/719 |
| 5,305,187 | 4/1994 | Umezu et al. | 361/829 X |
| 5,305,879 | 4/1994 | Noschese | 206/718 |
| 5,315,239 | 5/1994 | Vitriol | |
| 5,318,451 | 6/1994 | Del Prete et al. | 439/69 |
| 5,343,366 | 8/1994 | Cipolla et al. | |
| 5,360,109 | 11/1994 | Janota | 206/701 X |
| 5,394,010 | 2/1995 | Tazawa et al. | |
| 5,407,362 | 4/1995 | Carstens et al. | |

*Primary Examiner*—Jacob K. Ackun
*Attorney, Agent, or Firm*—Lowe, Price, LeBlanc & Becker

[57] ABSTRACT

A multiple device carrier is designed to hold ZIP or SIP packages tightly in its cells. The cells are spaced to provide air flow for cooling the packages and allowing heat generated within the packages to dissipate. The carrier is provided with a locking strip member to prevent loosening of the packages in the cells and allow leads of the packages to be aligned. The package assembly held by the carrier can be inserted into a socket to connect the circuit packages with external circuitry.

12 Claims, 6 Drawing Sheets

MULTIPLE DEVICE CARRIER

TECHNICAL FIELD

The present invention relates generally to integrated circuit packaging, and more particularly, to a carrier for a plurality of integrated circuit (IC) packages.

BACKGROUND ART

In an electronic system, components must be mounted on some interconnection network for communication to other parts of the system. The components of various types and configurations can be attached to a printed circuit board (PCB) to make the board a functional electronic device. To reduce costs of the assembly, semiautomatic or automatic insertion of components into PCBs are employed. However, multi-leaded components, e.g. integrated circuits, present problems for semiautomatic or automatic assembly because of lack of uniformity of body size and shape, difficulty of maintaining desired lead conditions, and feed problems at the input to insertion mechanisms. Successful mechanized assembly for integrated circuits is being achieved by using relatively standard integrated circuit (IC) packages. For example, dual in-line IC packages (DIP) that have two rows of vertical leads insertable into a PCB may be used for 256K dynamic RAMs.

For dynamic RAMs of 1M or more, zigzag in-line IC packages (ZIP) and single in-line IC packages (SIP) are used. Referring to FIGS. 1A and 1B respectively showing side and bottom views of a ZIP package, this type of IC package has two rows of leads L1–L20 arranged in a zigzag pattern along the bottom edge of the package. As shown in FIG. 1C, the ZIP package may comprise a semiconductor chip 10 sealed by a sealing 12 made of epoxy resin. The leads L1–L20 may be connected to bonding pads of the chip 10 using gold wires. For example, a 1M×9 or 4M×9 RAM may be incorporated into the chip 10. As shown in FIG. 2, a SIP package has a single row of leads aligned along the bottom edge.

Suitable packages for an integrated circuit must satisfy a series of requirements. They must be strong enough mechanically to withstand the stresses occurring during use and provide easily established and reliable electrical connection from the circuit inside to the outer world.

To provide an IC package assembly, for example, a memory module of very high capacity, a group of IC packages are usually assembled on a printed circuit (PC) carrier interconnected with a system PCB that carries the circuits to be connected with the inner circuits of the IC packages. FIG. 3 illustrates an example of a module having nine IC packages 2 mounted on a PC carrier 4 inserted into a system PCB 6. Soldering is used for attaching the IC packages to the PC carrier. However, the manufacturing of the PCB-based assembly is a very demanding and expensive technological endeavor requiring sophisticated processes and machinery. In particular, the manufacturing sequence may incorporate the steps of solder paste application, solder paste baking out, reflow soldering, solvent cleaning and final inspection.

Moreover, due to miniaturization, any soldering procedure substantially affects the quality and reliability of the assembly and reduces its life expectancy.

Further, due to high packaging densities, heat generated within the packages can damage the packaged circuit. Metal heat sinks or other heat transfer means should be bonded to the PC carrier to absorb and disperse heat from operating IC packages. As a result, packaging density is reduced and manufacturing cost is increased.

Therefore, it would be desirable to provide a carrier for a group of IC packages that allows the IC package assembly to be produced without using a PC carrier. Also, it would be desirable to produce the IC package assembly without soldering.

DISCLOSURE OF THE INVENTION

Accordingly, one advantage of the invention is in providing a multiple device carrier that allows an IC package assembly composed of a plurality of IC packages to be produced without a PC carrier.

Another advantage of the invention is in providing a multiple device carrier that allows IC packages to be assembled into IC package assembly without soldering.

The above and other advantages of the invention are achieved, at least in part, by providing a structure for carrying IC packages that comprises a plurality of longitudinal elements extending in parallel across the top and bottom horizontal surfaces of the structure between its opposite transverse ribs. A plurality of side elements extends across the side surfaces of the structure between the top and bottom longitudinal elements. Cells for holding the IC packages are provided between the top and bottom longitudinal elements and the side elements. The top and bottom longitudinal elements are respectively spaced across the top and bottom surfaces so as to accommodate the IC packages therebetween.

In accordance with one aspect of the invention, the cells are spaced so as to provide air flow for cooling the IC packages and allow heat generated within the IC packages to dissipate.

In accordance with another aspect of the invention, a locking member is provided along one of the transverse ribs to prevent loosening of the IC packages in the cells. The locking member may comprise a strip element inclined with respect to the top and side surfaces so as to accommodate oblique cuts on the IC packages.

Preferably, the longitudinal and side elements are made of elastic material to hold the IC packages tightly.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Although the invention has general applicability in the field of electronic packaging, the best mode for practicing the invention is based in part on the realization of a multiple device carrier for carrying single in-line packages (SIP) and zigzag in-line packages (ZIP) which have terminals or lead wires only along one edge of the package.

Figure 3:
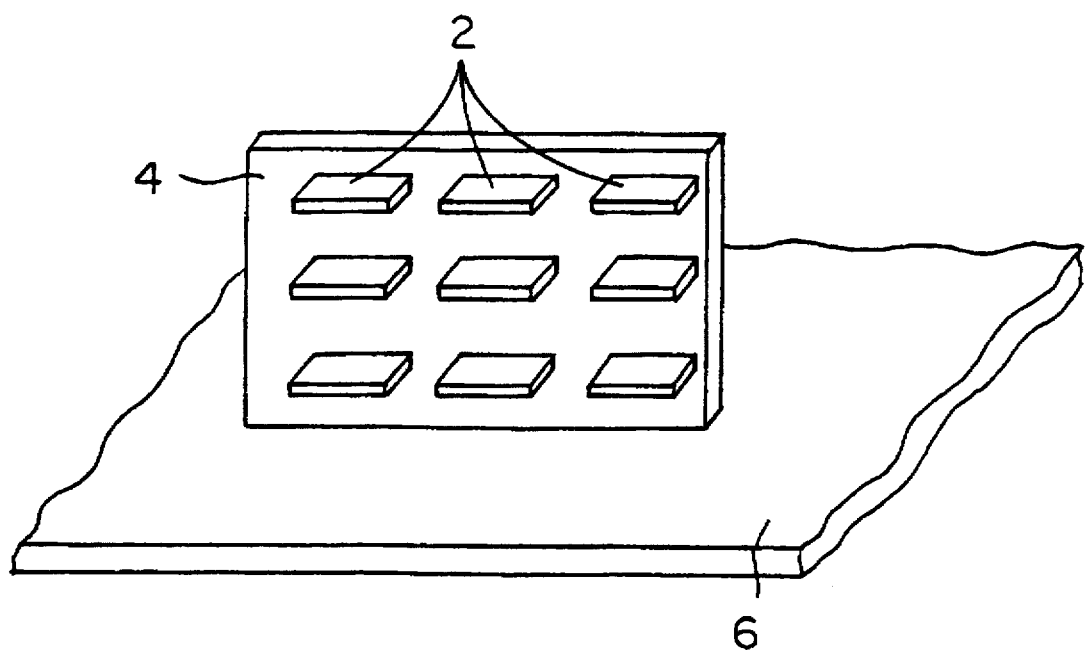
FIG. 3 illustrates a module mounted on a PC carrier.
Figure 4:
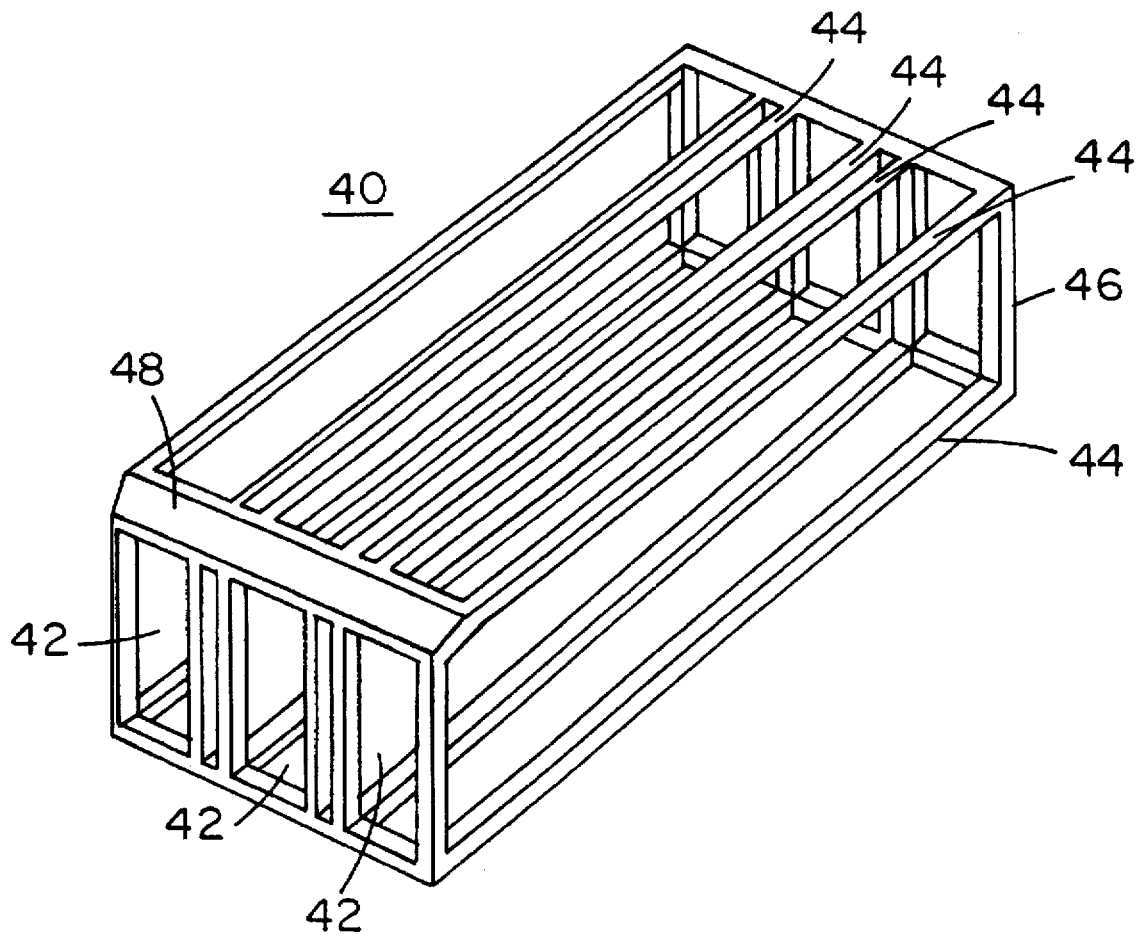
FIG. 4 illustrates a multiple device carrier for holding three packages.

Reference is now made to FIG. 4 showing a multiple device carrier 40 having a plurality of cells 42 of parallel-epiped configuration arranged so as to hold a single ZIP or SIP package in each of the cells. Although (FIG. 3) illustrates the device carrier 40 having three cells 42 for holding three SIP or ZIP packages, it is to be understood that any number of the cells 42, preferably two or greater, can be provided in the device carrier 40.

Each of the cells 42 comprises two pairs of parallel longitudinal elements 44 extending between opposite transverse ribs of the carrier 40 across its top and bottom surfaces, and two pairs of parallel side elements 46 extending across the opposite side surfaces of the carrier 40. The side elements 46 are arranged between the corresponding top and bottom longitudinal elements 44 perpendicular to them. In each cell, the longitudinal elements 44 are spaced so as to fix a package tightly in the cell. Also, the distances between the top and bottom longitudinal elements 44 across the side surface of the carrier 40 are selected to accommodate the packages firmly. The carrier may be made of elastic material, e.g. plastic, to ensure that the packages are held tightly in the cells 42.

The adjacent elements of the neighboring cells 42 are spaced by a distance that provides an air flow for cooling the packages and allows heat generated within the packages to dissipate.

Figure 2:
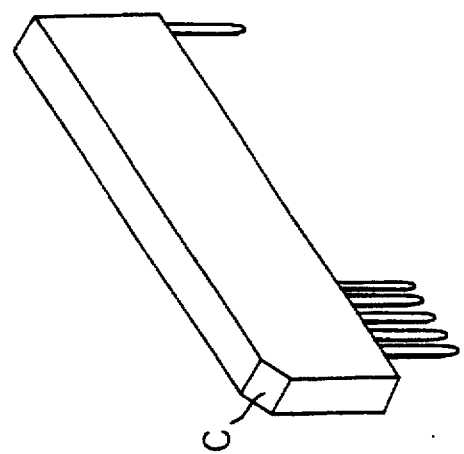
FIG. 2 shows an example of a SIP package.
Figure 1A:
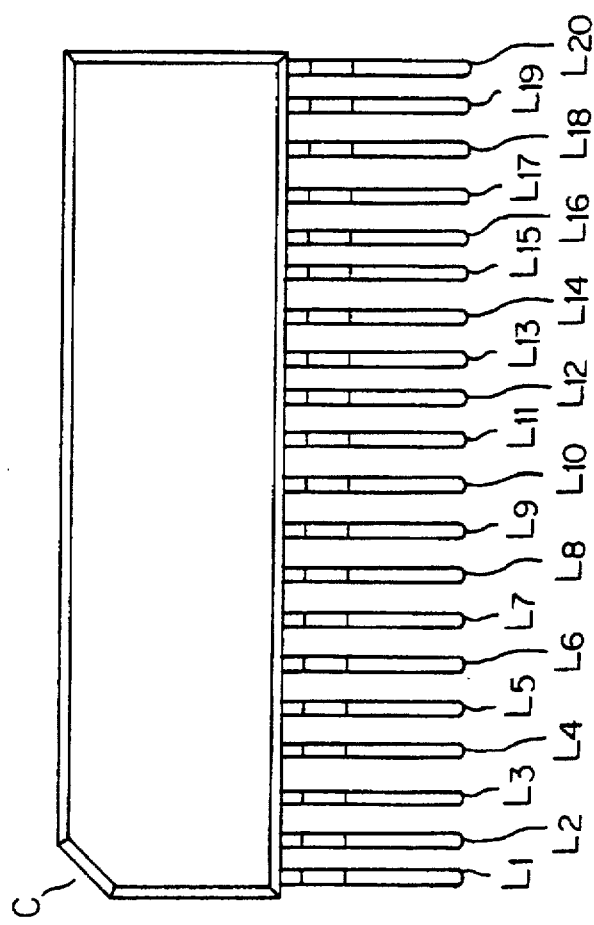
FIGS. 1A–1B show side and bottom views of a ZIP package.
Figure 1B:
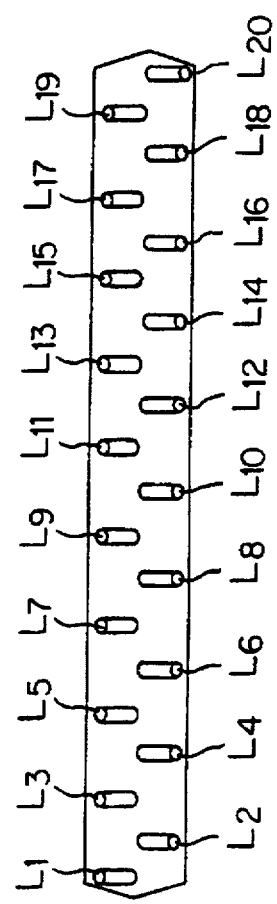
Figure 1C:
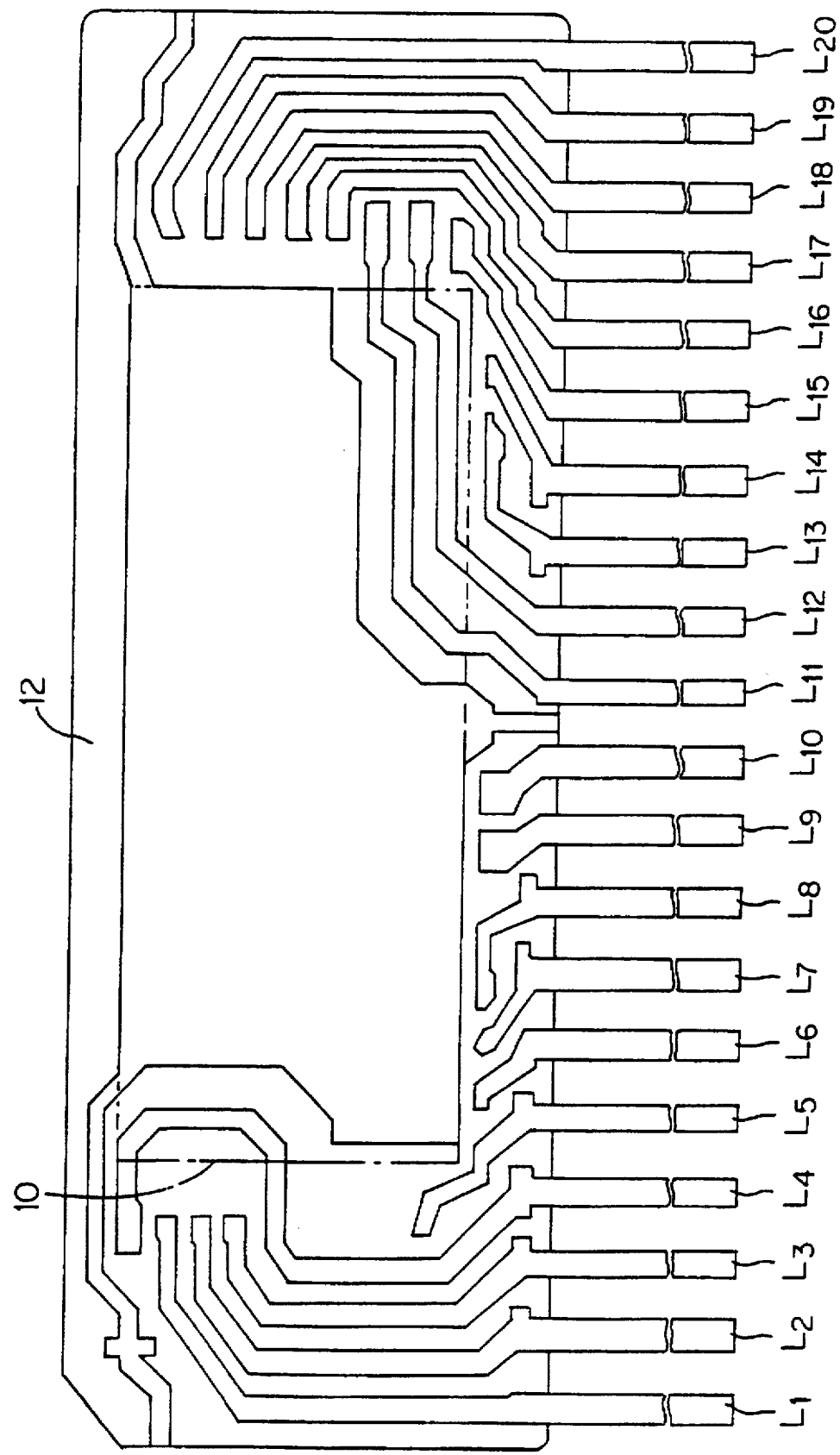
FIG. 1C illustrates an exemplary internal structure of the ZIP package shown in FIGS. 1A–1B.

A holding strip member 48 is provided along one of the upper transverse ribs of the carrier 40 to prevent loosening of the packages in the cells 42. The holding strip member 48 is inclined with respect to the top and side surfaces of the carrier 40 so as to accommodate an oblique cut C (FIGS. 1A and 2) provided at the upper front edge of each SIP or ZIP package inserted into the cell 42.

Figure 5:
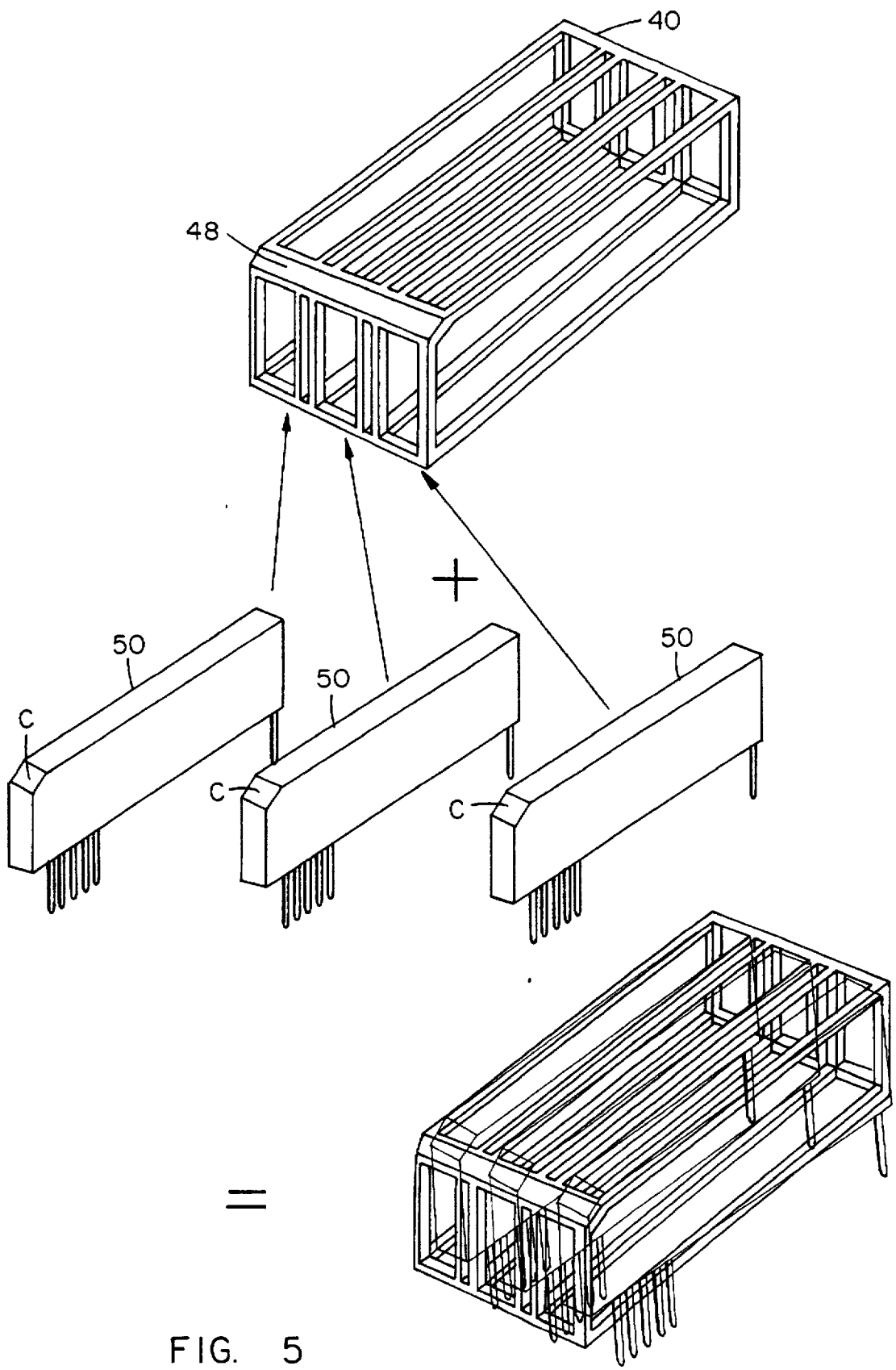
FIG. 5 illustrates insertion of the packages into the multiple device carrier.

As shown in FIG. 5, SIP or ZIP packages 50 can be inserted into the carrier 40 from its bottom surface. The packages 50 are pushed into the cells 42 until their oblique cuts C are positioned along the holding strip member 48. As a result, the packages 50 are fixed in aligned positions and have their leads projecting beyond the bottom surface of the carrier 40.

Figure 6:
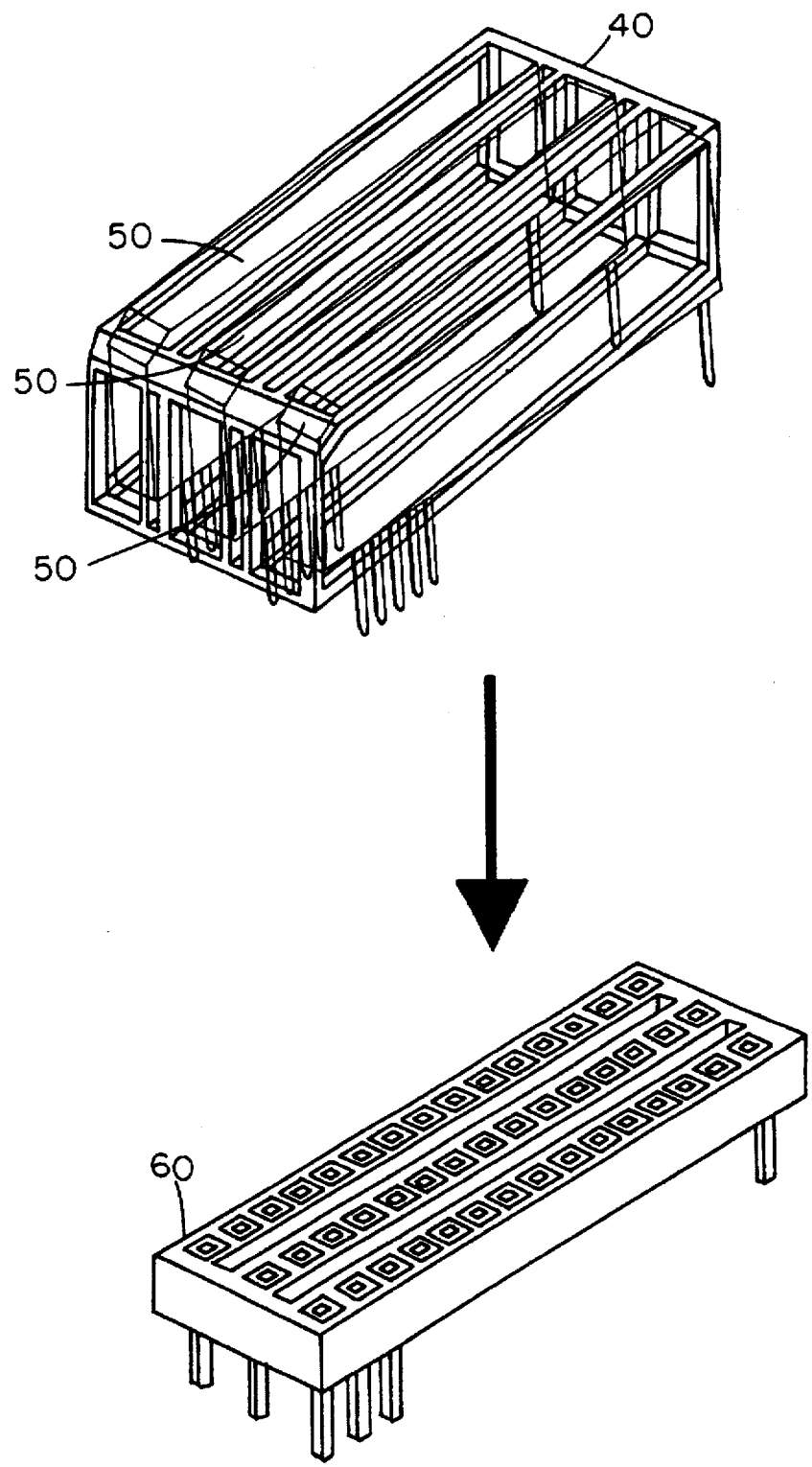
FIG. 6 illustrates insertion of the carrier filled with packages into a socket.

Referring to FIG. 6, the package assembly held by the carrier 40 may be inserted into a socket 60 to provide electrical connection between the inner circuits of the packages 50 and the outer circuits coupled to the socket 60. Alternatively, the package assembly may be soldered onto a system printed circuit board that carries the circuits to be connected with the inner circuits of the packages 50.

In summary, the results and advantages of the multiple device carrier can now be more fully appreciated. The carrier is designed to hold ZIP or SIP packages tightly in its cells. The cells are spaced to provide air flow for cooling the packages and to allow heat generated within the packages to dissipate. The carrier is provided with locking strip member to prevent loosening of the packages in the cells and to align the leads of the packages with respect to each other and to a connector or circuit board. The package assembly held by the carrier can be inserted into a socket to connect circuits within the packages with external circuitry.

Accordingly, the multiple device carrier of the present invention allows an IC package assembly composed of a plurality of IC packages to be produced without a PC carrier.

It will also be recognized that the multiple device carrier of the present invention allows the IC packages to be assembled into the IC package assembly without soldering.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

I claim:

1. An electronic package assembly comprising:

a plurality of top longitudinal strips extending in parallel across a top surface of the assembly between opposite top transverse ribs thereof, a plurality of bottom longitudinal strips extending in parallel across a bottom surface of the assembly between opposite bottom transverse ribs thereof, a plurality of side strips extending across side surfaces of the structure between said top and bottom longitudinal strips, one of the top traverse ribs defining a holding strip inclined with respect to said top and side surfaces between said top longitudinal strips and said side strips, and a plurality of electronic packages insertable from said bottom surface of the assembly into openings defined by distances between said bottom longitudinal strips, the electronic packages having leads projecting through said openings beyond said bottom longitudinal strips, and having oblique cuts positioned along said holding strip.

2. The assembly of claim 1, wherein cells for holding said electronic packages are established between said top and bottom longitudinal elements and said side elements, said cells are spaced so as to provide air flow between said cells for cooling said electronic packages and allow heat generated within said electronic packages to dissipate.

3. The assembly claim 2, wherein said holding strip is inclined to accommodate the oblique cuts on said electronic packages to prevent loosening of said electronic packages in said cells.

4. The assembly of claim 2, wherein said holding strip is inclined with respect to said top and side surfaces so as to accommodate the oblique cuts on said electronic packages.

5. The assembly of claim 1, wherein at least said longitudinal and side strips are made of elastic material to hold said electronic packages tightly.

6. The assembly of claim 1, wherein said electronic packages are single in-line packages.

7. The assembly of claim 1, wherein said electronic packages are zigzag in-line packages.

8. An integrated circuit (IC) package assembly comprising:

a plurality of cells provided side by side within said assembly, each of said cells including:

a pair of parallel top longitudinal strips provided between opposite top transverse ribs of said assembly, a pair of parallel bottom longitudinal strips provided between opposite bottom transverse ribs of said assembly, and two pairs of side strips provided perpendicular to said top and bottom longitudinal strips and said top and bottom transverse ribs, and a a plurality of IC packages insertable from said bottom surface of the assembly into said plurality of cells through openings defined by distances between said bottom longitudinal strips, each of the IC packages having leads arranged along a bottom edge and projecting through said openings beyond said bottom longitudinal strips, and an oblique cut formed on a top front edge, one of the top traverse ribs defining a holding strip arranged between said top longitudinal strips and said side strips and inclined with respect to said top and side surfaces so as to accommodate an oblique cut on each of the IC packages.

9. The assembly of claim 8, wherein the bottom longitudinal elements in said pair are spaced so as to accommodate said IC packages tightly.

10. The assembly of claim 8, wherein said holding strip strip is provided on a surface inclined with respect to said top longitudinal elements at an angle equal to an inclination angle of the oblique cut on each of said IC packages.

11. The assembly of claim 8, wherein said longitudinal and side strips, and said transverse ribs are made of elastic material.

12. The assembly of claim 8, wherein said cells are spaced with respect to one another so as to provide air flow for cooling the IC packages between the cells.

* * * * *